US011037972B2

(12) United States Patent
Neya

(10) Patent No.: US 11,037,972 B2
(45) Date of Patent: Jun. 15, 2021

(54) IMAGING DEVICE, IMAGING APPARATUS, AND ELECTRONIC DEVICE

(71) Applicant: SONY SEMICONDUCTOR SOLUTIONS CORPORATION, Kanagawa (JP)

(72) Inventor: Koji Neya, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 51 days.

(21) Appl. No.: 16/343,529

(22) PCT Filed: Oct. 19, 2017

(86) PCT No.: PCT/JP2017/037791
§ 371 (c)(1),
(2) Date: Apr. 19, 2019

(87) PCT Pub. No.: WO2018/083990
PCT Pub. Date: May 11, 2018

(65) Prior Publication Data
US 2019/0333951 A1 Oct. 31, 2019

(30) Foreign Application Priority Data
Nov. 2, 2016 (JP) ............................ JP2016-215045

(51) Int. Cl.
*H01L 27/146* (2006.01)
*H04N 9/04* (2006.01)

(52) U.S. Cl.
CPC .. *H01L 27/14623* (2013.01); *H01L 27/14645* (2013.01); *H01L 27/14685* (2013.01); *H04N 9/045* (2013.01)

(58) Field of Classification Search
CPC ............ H01L 21/302; H01L 27/14603; H01L 27/14612; H01L 27/14623; H01L 27/1463; H01L 27/14645; H01L 27/14685
See application file for complete search history.

(56) References Cited

U.S. PATENT DOCUMENTS

2005/0139943 A1* 6/2005 Kanbe .............. H01L 27/14643 257/431
2006/0014360 A1 1/2006 Matsumoto
(Continued)

FOREIGN PATENT DOCUMENTS

JP 2006-032549 2/2006
JP 2013-065688 4/2013
(Continued)

OTHER PUBLICATIONS

International Search Report prepared by the Japan Patent Office dated Nov. 15, 2017, for International Application No. PCT/JP2017/037791.

*Primary Examiner* — Robert G Bachner
(74) *Attorney, Agent, or Firm* — Sheridan Ross P.C.

(57) ABSTRACT

The present disclosure relates to an imaging device, an imaging apparatus, and an electronic device capable of light-shielding a charge accumulation unit at low cost, while maintaining a charge transfer path from a photodiode to a charge accumulation unit. A depth of a trench that forms a trench buried film having a light-shielding characteristic for preventing color mixture of the photodiodes is adjusted according to a contact amount of a reactive gas by adjusting, among the shapes of a photomask pattern, a width of the trench through which the reactive gas flows or the number of intersections of the trenches at a portion in which the trench buried film is formed. As a result, the trench buried films having a plurality of depths can be formed by a single
(Continued)

dry etching with one mask pattern, and the manufacturing cost is reduced. Application to an imaging device is possible.

19 Claims, 11 Drawing Sheets

(56) References Cited

U.S. PATENT DOCUMENTS

| | | | | |
|---|---|---|---|---|
| 2011/0138343 | A1* | 6/2011 | Granik | G03F 7/705 716/54 |
| 2013/0070131 | A1* | 3/2013 | Ohkubo | H04N 5/374 348/294 |
| 2013/0073131 | A1 | 3/2013 | Ohkubo et al. | |
| 2014/0131779 | A1 | 5/2014 | Takeda et al. | |
| 2014/0327051 | A1 | 11/2014 | Ahn et al. | |
| 2015/0069471 | A1 | 3/2015 | Kawamura | |

FOREIGN PATENT DOCUMENTS

| | | |
|---|---|---|
| JP | 2014-096490 | 5/2014 |
| JP | 2015-023259 | 2/2015 |
| JP | 2015-053411 | 3/2015 |
| WO | WO 2016/143531 | 9/2016 |

* cited by examiner

IMAGING DEVICE, IMAGING APPARATUS, AND ELECTRONIC DEVICE

CROSS REFERENCE TO RELATED APPLICATIONS

This application is a national stage application under 35 U.S.C. 371 and claims the benefit of PCT Application No. PCT/JP2017/037791 having an international filing date of 19 Oct. 2017, which designated the United States, which PCT application claimed the benefit of Japanese Patent Application No. 2016-215045 filed 2 Nov. 2016, the entire disclosures of each of which are incorporated herein by reference.

TECHNICAL FIELD

The present disclosure relates to an imaging device, an imaging apparatus, and an electronic device, and more particularly to an imaging device, an imaging apparatus, and an electronic device capable of light-shielding a charge accumulation unit at low cost while maintaining a charge transfer path from a photodiode to a charge accumulation unit.

BACKGROUND ART

A typical imaging device adopted in an imaging apparatus is configured to prevent color mixture between pixels by forming a light shielding structure while maintaining charge transfer paths from photodiodes to charge accumulation units (see Patent Document 1).

CITATION LIST

Patent Document

Patent Document 1: Japanese Patent Application Laid-Open No. 2014-096490

SUMMARY OF THE INVENTION

Problems to be Solved by the Invention

However, the technology disclosed in Patent Document 1 mentioned above needs to perform multiple times of processing from rear side or multiple times of processing from both sides to form a light shielding structure of the charge accumulation units, while maintaining charge transfer paths from photodiodes to charge accumulation units. Therefore, a plurality of photomask patterns is required for etching, and the number of steps also increases corresponding to the number of times of processing. As a result, the manufacturing cost may increase.

The present disclosure has been made in view of such a situation. In particular, it is intended to light-shield a charge accumulation unit at low cost while maintaining a charge transfer path from a photodiode to a charge accumulation unit.

Solution to Problems

An imaging device according to an aspect of the present disclosure includes a plurality of photodiodes arranged in an array and generating an electric charge according to an amount of incident light, a charge accumulation unit that accumulates the electric charge transferred from each of the photodiodes, and a light shielding wall that separately light-shields the photodiodes and the charge accumulation unit, in which the light shielding wall is configured to surround the charge accumulation unit, with a part of the light shielding wall having a first depth and the other parts of the light shielding wall having a second depth, and the first depth and the second depth of the light shielding wall are formed by dry etching with a photomask pattern using a processing conversion difference caused by a microloading effect.

The light shielding wall is configured to surround the charge accumulation unit, in which a portion functioning as a charge transfer path for transferring the electric charge from each of the photodiodes to the charge accumulation unit is formed to have a first depth not reaching a substrate layer from a surface on which the photodiodes are arranged in an array, and the other portions are formed to have a second depth reaching the substrate layer from the surface on which the photodiodes are arranged in an array, so that the light shielding wall having the first depth and the second depth is formed by a single dry etching with one photomask pattern controlled using the processing conversion difference caused by the microloading effect.

The charge accumulation unit may be shared by a plurality of photodiodes, and the charge transfer path may be formed between the charge accumulation unit and each of the plurality of photodiodes.

The photomask pattern can be formed to control the depth of a trench formed as the light shielding wall by dry etching by controlling the contact amount of a reactive gas, which is used in the dry etching, on a silicon substrate.

In the photomask pattern, the contact amount is controlled by adjusting a contact area of the reactive gas, which is used in the dry etching, on the silicon substrate or the number of flow paths of the reactive gas, so that the depth of the trench forming the light shielding wall by the dry etching can be controlled.

The contact amount of the reactive gas according to the number of the flow paths can be controlled by forming the photomask pattern in an annular structure surrounding the charge accumulation unit.

The annular structure may be circular, rhombic, rectangular, or polygonal.

The charge accumulation unit may include a floating diffusion region and a memory.

The light shielding wall may be constituted by an insulating film having permeability and a refractive index lower than the refractive index of silicon, or an insulating film with a light shielding metal provided inside the insulating film.

An imaging apparatus according to an aspect of the present disclosure includes a plurality of photodiodes arranged in an array and generating charges according to an amount of incident light, a charge accumulation unit that accumulates charges transferred from the photodiodes, and a light shielding wall that separately light-shields the photodiode and the charge accumulation unit, in which the light shielding wall is configured to surround the charge accumulation unit, with a part of the light shielding wall having a first depth and the other parts of the light shielding wall having a second depth, and the first depth and the second depth of the light shielding wall are formed by dry etching with a photomask pattern using a processing conversion difference caused by a microloading effect.

An electronic device according to an aspect of the present disclosure includes a plurality of photodiodes arranged in an array and generating charges according to an amount of incident light, a charge accumulation unit that accumulates charges transferred from the photodiodes, and a light shielding wall that separately light-shields the photodiode and the charge accumulation unit, in which the light shielding wall is configured to surround the charge accumulation unit, with a part of the light shielding wall having a first depth and the other parts of the light shielding wall having a second depth, and the first depth and the second depth of the light shielding wall are formed by dry etching with a photomask pattern using a processing conversion difference caused by a micro-loading effect.

According to the one aspect of the present disclosure, the plurality of photodiodes arranged in an array and generating an electric charge according to an amount of incident light and the charge accumulation unit that accumulates the electric charge transferred from the photodiodes are individually light-shielded by the light shielding wall, the light shielding wall is configured to surround the charge accumulation unit, with a part of the light shielding wall having the first depth and the other parts of the light shielding wall having the second depth, and the first depth and the second depth of the light shielding wall are formed by dry etching with the photomask pattern using the processing conversion difference caused by the microloading effect.

Effects of the Invention

According to the aspect of the present disclosure, the charge accumulation unit is capable of being light-shielded at low cost, while maintaining the charge transfer path from each of the photodiodes to the charge accumulation unit.

MODE FOR CARRYING OUT THE INVENTION

Figure 1:
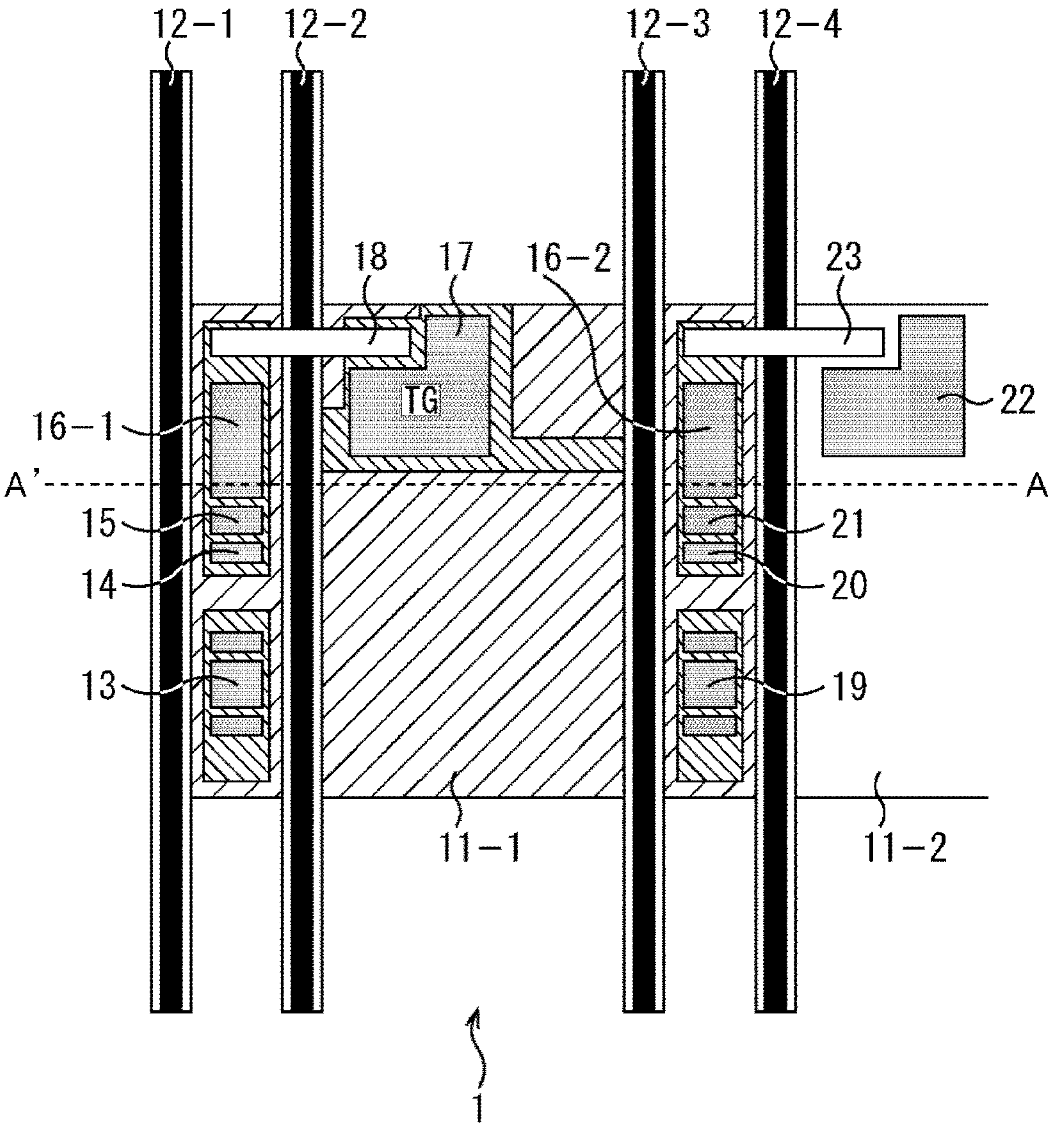
FIG. 1 illustrates a first configuration example of a conventional imaging device.

Preferred embodiments of the present disclosure will be described in detail below with reference to the accompanying drawings. Note that, in the present specification and the drawings, the same reference numerals are given to constituent elements having substantially the same functional configuration to eliminate redundant explanation.

Furthermore, explanation will be given in the following order.

1. Outline of Conventional Imaging Device
2. First Embodiment
3. Manufacturing Processing of Imaging Device in FIG. 3
4. First Modification
5. Second Modification
6. Third Modification
7. Fourth Modification
8. Application Example to Electronic Device
9. Usage Example of Imaging Device

1. Outline of Conventional Imaging Device

To describe the imaging device of the present disclosure, an outline of a conventional imaging device will first be described.

<<First Configuration Example of Conventional Imaging Device>>

FIG. 1 illustrates a configuration of a unit pixel of a conventional imaging device when viewed from the top (from the side opposite to a light receiving surface. The configuration illustrated in FIG. 1 is a two-pixel sharing configuration in which a photodiode 11-1 and a photodiode 11-2 located on the right side of the photodiode 11-1 share a reset gate and the like.

The unit pixel 1 includes the photodiode 11-1 in the center portion which, however, is not directly visible because there is a P region when viewed from the top, but is indicated by a reference numeral in FIG. 1 to illustrate the positional relationship with other portions.

A floating gate (FG) 15, a floating diffusion region (FD) 14, and a reset gate (RST) 13 are arranged so as to be arranged under a memory unit 16-1. The reset gate 13 is shared by the photodiode 11-1 and the photodiode 11-2.

Furthermore, a transfer gate (TG) 17 is disposed in a part of the photodiode 11-1. A wiring 18 is arranged so as to connect the transfer gate 17 and the memory unit 16-1. On the right side of the photodiode 11-1, a memory unit 16-2 for the photodiode 11-2, a floating gate 21 and a floating diffusion region 20 arranged on the right side of the photodiode 11-1 are provided. Then, an amplification transistor (amplifier: AMP) 19 is provided below the floating diffusion region 20. The amplification transistor 19 is shared with a plurality of photodiodes and, in this case, shared by the photodiode 11-1 and the photodiode 11-2.

The transfer gate 17 of the unit pixel 1 having such a configuration is photoelectrically converted by the photodiode 11-1, and charges accumulated in the photodiode 11-1 are transferred to the memory unit 16-1 via the wiring 18 by applying a drive signal to the gate electrode. Similarly, the transfer gate 22 transfers, via a wiring 23, the charges that have been photoelectrically converted in the photodiode 11-2 and accumulated in the photodiode 11-2 to the memory unit 16-2 when a drive signal is applied to the gate electrode.

The memory unit 16-1 is shielded from light by a light shielding film 12-1 and a light shielding film 12-2. As illustrated in FIG. 1, a light shielding film 12-1 and a light shielding film 12-2 are provided so as to surround the memory unit 16-1. Therefore, the memory unit 16-1 is light-shielded by the light shielding films 12-1 and 12-2. Furthermore, as illustrated in FIG. 1, the light shielding film 12 is provided in a state sandwiched between insulating films.

Thus, the light shielding film 12-2 is provided between the photodiode 11-1 and the memory unit 16-1, the electric charge from the photodiode 11-1 is transferred via the wiring 18. Note that, as will be described later in detail, the configuration may not include the wiring 18 by partially eliminating the insulating film and the light shielding film 12 and the transfer gates are provided at the eliminated portion.

The floating gate 15 of the unit pixel 1 transfers the electric charge accumulated in the memory unit 16-1 to the floating diffusion region 14 when a driving signal is applied to the gate electrode of the floating gate 15. The floating diffusion region 14 is a charge-to-voltage conversion unit including an N-type layer, and converts the electric charge transferred from the memory unit 16-1 into voltage under the control of the floating gate 15.

The unit pixel 1 further includes the reset gate 13 and the amplification transistor 19 which are shared with the photodiode 11-2. The reset gate 13 is connected between the power supply and the floating diffusion region 14, and resets the floating diffusion region 14 and the floating diffusion region 20 by applying a driving signal to the gate electrode.

The amplification transistor 19 has its drain electrode connected to the power supply and its gate electrode connected to the floating diffusion region 14, and reads the voltage of the floating diffusion region 14. Although not illustrated in the drawing, the unit pixel 1 also includes a selection transistor which, for example, has its drain electrode connected to a source electrode of the amplification transistor 19, and its source electrode connected to a vertical signal line (not illustrated), whereby the unit pixel 1 from which the pixel signal should be read is selected when the drive signal is applied to the gate electrode. Another circuit structure in which the selection transistor is connected between the power source and the drain electrode of the amplification transistor 19 may also be possible.

The imaging device (CMOS image sensor) configured as described above starts exposure of all pixels simultaneously and finishes exposure of all pixels simultaneously, thus transferring the electric charge accumulated in the photodiode 11-1 to the light-shielded memory unit 16 to achieve a global shutter operation (global exposure). With this global shutter operation, it is possible to perform imaging with no distortion due to the exposure period in which all the pixels match.

<<Second Configuration Example of Conventional Imaging Device>>

Figure 2:
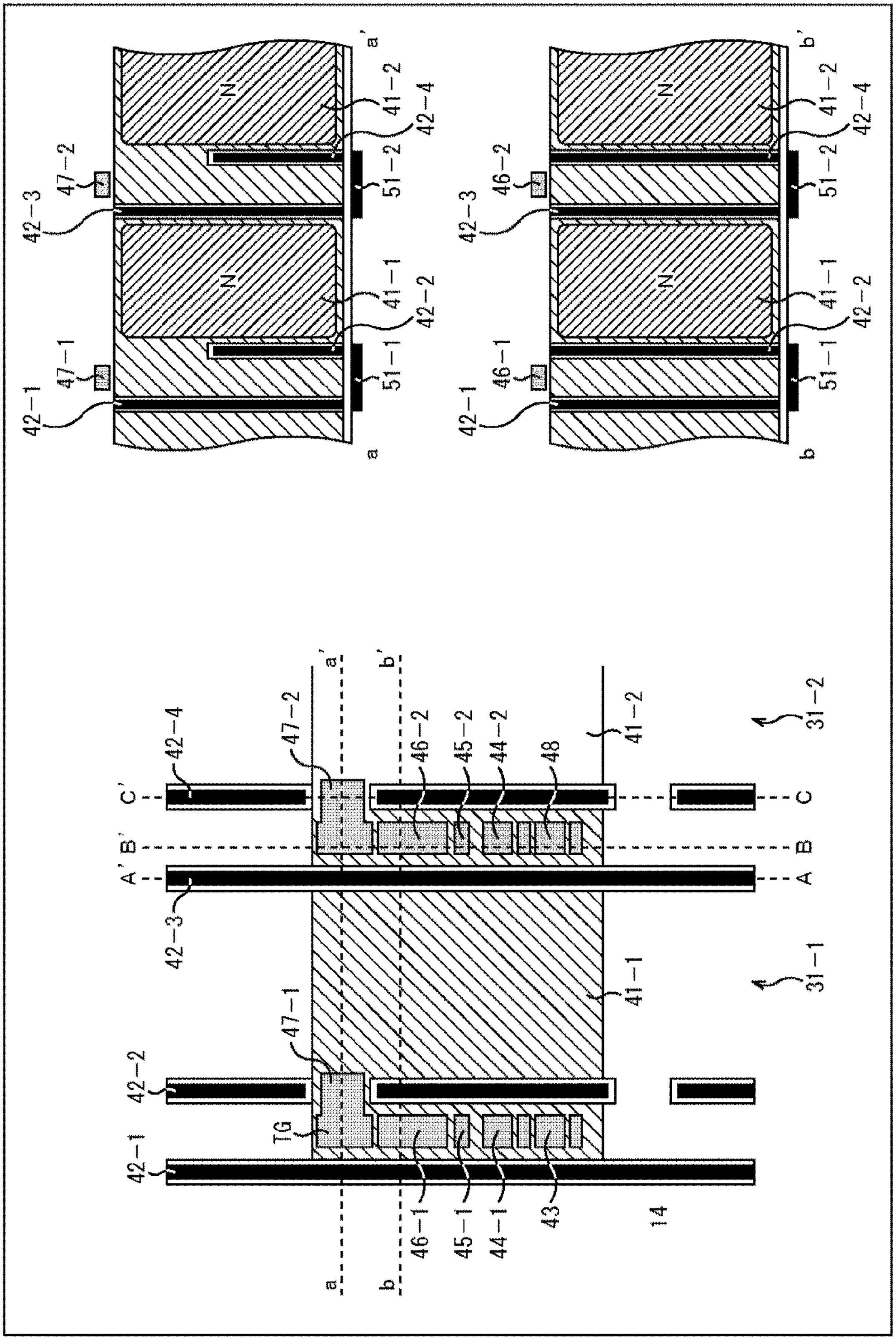
FIG. 2 illustrates a second configuration example of a conventional imaging device.

In the conventional imaging device of FIG. 1, the transfer gate 17 and the memory unit 16-1 are connected via the wiring 18, but the wiring 18 may be omitted. The left part of FIG. 2 illustrates a configuration when the unit pixel which is arranged to omit the wiring 18 is viewed from the top (from the side opposite to the light receiving surface). Furthermore, the upper right part of FIG. 2 illustrates side views of the unit pixel illustrated in the left part of FIG. 2.

The configuration of a unit pixel 31-1 illustrated in FIG. 2 is basically similar to the configuration of the unit pixel 1 illustrated in FIG. 1. In other words, the unit pixel 31 includes a photodiode 41-1, a transfer gate 47-1, a memory unit 46-1, a floating gate 45-1, a floating diffusion region 44-1, a reset gate 43, and an amplification transistor 48.

The unit pixel 31-1 illustrated in FIG. 2 is also a two-pixel sharing type unit pixel, and the reset gate 43 and the amplification transistor 48 are shared by the photodiode 41-1 and the photodiode 41-2. The unit pixel 31 illustrated in FIG. 2 is compared with the unit pixel 1 illustrated in FIG. 1.

Similar to the unit pixel 1 illustrated in FIG. 1, the memory unit 46-1, the floating gate 45-1, the floating diffusion region 44-1, and the reset gate 43 of the unit pixel 31-1 illustrated in FIG. 2 are disposed between light shielding films 42-1 and 42-2. Likewise, a memory unit 46-2, a floating gate 45-2, a floating diffusion region 44-2, and an amplification transistor 48 are disposed between light shielding films 42-3 and 42-4.

A part of the light shielding film 42-2 is opened to the photodiode 41-1 side, and a transfer gate 47-1 is provided in the opened portion. Since the transfer gate 47-1 is provided by opening a part of the light shielding film 42-2, the electric charge from the photodiode 41-1 is transferred to the memory unit 46-1 without passing through the wiring.

Similarly, in other unit pixels, such as a unit pixel 31-2, a part of the light shielding film 42-4 is opened to the photodiode 41-2 side, and the transfer gate 47-2 is provided in the opened portion. Thus, it is possible to open a part of the light shielding film and provide a transfer gate in the opened part.

Thus, the configuration in which the charge is transferred from the photodiode 41-1 to the memory unit 46-1 without using wirings allows electric charges to be transferred on the silicon substrate, thus decreasing noise and reducing influence of the noise.

The right part of FIG. 2 illustrates side views of the unit pixel 31-1 illustrated in the left part of FIG. 2. An upper right view of FIG. 2 is a side view of a cross-section when the unit pixel 31-1 illustrated in the left part of FIG. 2 is cut along line a-a', and a lower right view of FIG. 2 is a side view of a cross-section when the unit pixel 31-1 illustrated in the left part of FIG. 2 is cut along line b-b'.

The side view illustrated at the upper right portion of FIG. 2 corresponds to a position where the transfer gate 47-1 is located, so that the light shielding film 42-2 is provided upward from the lower surface of the unit pixel 31-1, but provided halfway and does not reach the upper surface of the unit pixel 31-1. In contrast to the light shielding film 42-2, the light shielding film 42-1 is provided penetrating through the unit pixel 31-1 from the lower surface to the upper surface of the unit pixel 31-1. Thus, the light shielding film 42 is provided halfway in the portion where the transfer gate 47 is provided and the other light shielding film 42 is provided penetrating through the substrate.

The side view illustrated in the lower right part of FIG. 2 corresponds to a position where the transfer gate 47 is not located, so that the light shielding film 42 is provided penetrating through the substrate from the lower surface to the upper surface of the substrate.

Furthermore, as illustrated in the upper and lower right parts of FIG. 2, a light shielding film 51-1 is provided between the two light shielding films 42, for example, between the light shielding film 42-1 and the light shielding film 42-2 on the lower surface of the substrate. The light shielding film 51 is provided to reduce the influence of unnecessary light from the rear surface side.

To form the light shielding structure, however, in the conventional imaging device illustrated in FIGS. 1 and 2, while maintaining the charge transfer path from the photodiode to the memory serving as the charge accumulation unit or to the floating diffusion region (in the case of the configuration without memory and FG), it is necessary to perform a plurality of times of processing from the rear side or a plurality of times of processing from both the front and rear sides. This requires a plurality of photomask patterns and increases the number of steps by the number of times of processing corresponding to the number of photomask patterns. As a result, the manufacturing cost may increase.

2. First Embodiment

<Configuration Example of Imaging Device of Present Disclosure>

Therefore, the imaging device of the present disclosure can form a buried film capable of light-shielding the charge accumulation unit, while ensuring a charge transfer path from the photodiode to the charge accumulation unit with a small number of photomask patterns, thus preventing the increase of manufacturing cost.

Figure 3:
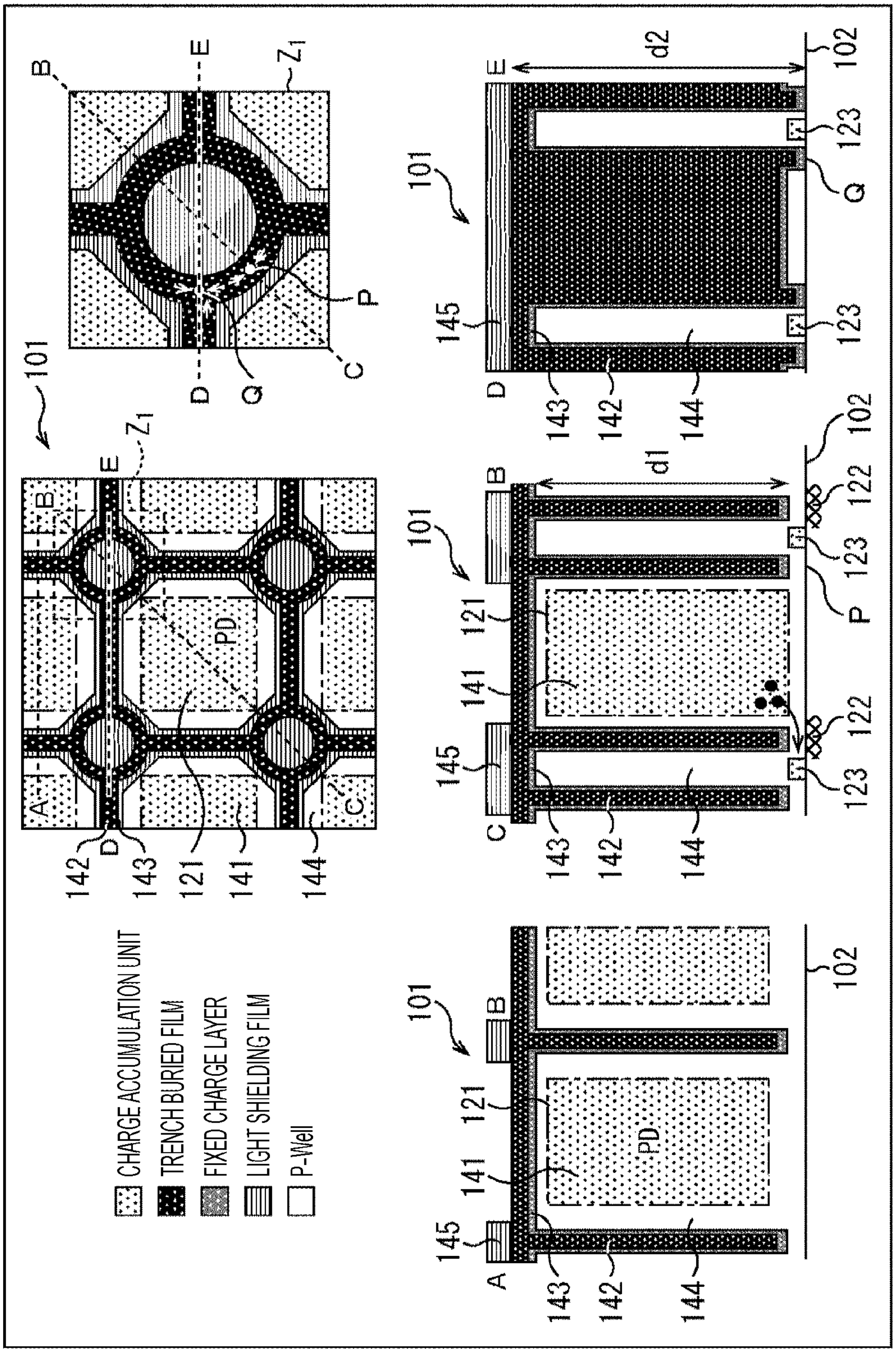
FIG. 3 illustrates a configuration example of an imaging device according to the present disclosure.

FIG. 3 illustrates a configuration example of the imaging device of the present disclosure. In FIG. 3, the upper center part illustrates a top view of an imaging device 101 when viewed in a direction of incident light, and the upper right part illustrates an enlarged view of a range Z1 of the upper center view of FIG. 3. Furthermore, in FIG. 3, the lower left part illustrates a cross-sectional view of the upper center part when cut along line A-B, the lower center part illustrates a cross-sectional view of the upper center part when cut along line C-B, and the lower right part illustrates a cross-sectional view of the upper center part when cut along line D-E.

Moreover, as illustrated in the upper center part of FIG. 3, the imaging device 101 includes photodiodes (PD) 121 each constituted by an N-type layer 141 and arranged in an array with respect to a P-well 144, and a light shielding film 145 is disposed to surround each photodiode 121 in a rectangular shape on the surface layer in a range excluding the upper surface of the photodiodes 121. Furthermore, when viewed in the direction of incident light (the direction from the front to rear of the paper in the upper center part of FIG. 3, or from the top to bottom in the lower part of FIG. 3), a trench buried film 142 is provided under the light shielding film 145 so as to surround each of the photodiodes 121 arranged in an array.

The trench buried film 142 is constituted by an insulating film having permeability and a refractive index lower than the refractive index of silicon, and transmits light to the photodiode 121, while light-shielding up to a critical angle at a portion formed in a deep trench called Deep Trench isolation (DTI), thus shielding light incident on adjacent photodiodes 121 and preventing color mixture. In other words, the trench buried film 142 configured in the DTI functions as a light shielding wall that substantially light-shields the photodiodes 121 individually and light-shields the charge accumulation units 123 individually.

Furthermore, the trench buried films 142 are linearly formed in the horizontal and vertical directions on the surface on which the photodiodes 121 are arranged in an array, as illustrated in the upper views in FIG. 3. Moreover, the trench buried films 142 are connected to each other at intersections having circular annular structures. Moreover, a fixed charge layer 143 is formed on the boundary between the trench buried film 142 and the P-well 144 to surround the entire boundary. Note that the trench buried film 142 includes the fixed charge layer 143 hereinafter, unless otherwise specified.

Furthermore, the charge accumulation unit 123 is formed on a substrate layer 102 serving as the center bottom portion of the trench buried film 142 formed in a circular annular structure when viewed in the light incidence direction. The charge accumulation unit 123 referred to herein is, for example, a floating diffusion region (FD) (hereinafter simply referred to as FD) illustrated in FIG. 4.

Figure 4:
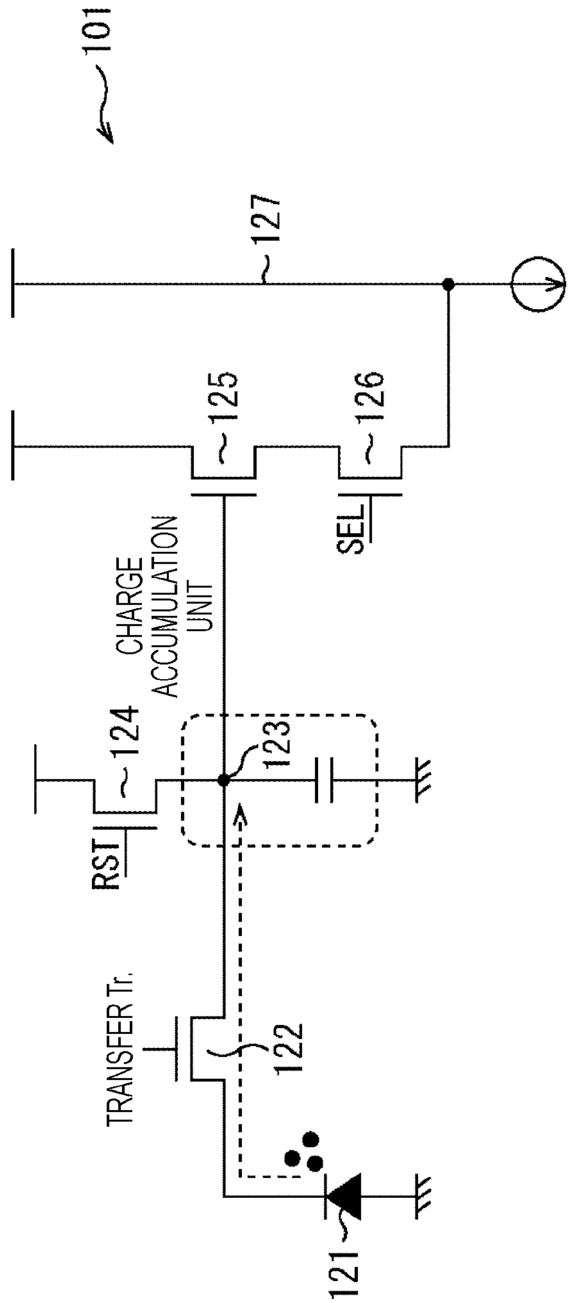
FIG. 4 illustrates an explanatory diagram of a pixel circuit of the imaging device in FIG. 3.

Note that FIG. 4 illustrates a wiring diagram of a typical pixel circuit. The pixel circuit illustrated in FIG. 4 includes a photodiode 121, a transfer transistor 122, a charge accumulation unit 123, a reset transistor 124, an amplification transistor 125, and a selection transistor (SEL) 126.

The photodiode 121 accumulates charges according to the amount of incident light. The transfer transistor (transfer Tr.) 122 transfers the electric charge accumulated in the photodiode 121 to the charge accumulation unit 123 constituted by floating diffusion region (FD). The reset transistor 124 operates when resetting the charge accumulation unit 123 or the photodiode 121.

The amplification transistor 125 receives voltage corresponding to the electric charge accumulated in the charge accumulation unit 123 at the gate of the amplification transistor 125, and outputs voltage corresponding to the voltage applied to the gate as a pixel signal. The selection transistor 126 is turned on and off according to the selection signal and is turned on when a selection signal is supplied at the time of transferring the pixel signal so that the pixel signal output from the amplification transistor 125 is output through the vertical transfer line 127.

A space having a light shielding characteristic is formed at the intersections of the trench buried films 142 in the circular annular structure in which the linear trench buried films 142 intersect in the horizontal direction and the vertical direction. The charge accumulation unit 123 keeps its light shielding characteristic as being formed in a space surrounded by the circular annular structure formed by the trench buried films 142 having the light shielding characteristic. Furthermore, a part of the trench buried films 142 in the circular annular structure is shallow so as not to reach the substrate layer 102, and the transfer transistor 122 is formed in this portion, as illustrated in the center lower view of FIG. 3, to ensure a charge transfer path.

Here, the trench buried film 142 in the circular annular structure is deep only at a portion of the surface of the trench buried film 142 where the pixel array is formed and intersects the linearly-formed trench buried film 142 by a micro-loading effect.

In other words, after the etching pattern is formed in the circular annular structure by photolithography, a reactive gas (including a reactive gas (etching gas), ions, radicals, etc.) is sprayed for dry etching to the surface on which the etching pattern is formed, and only a region where the trench buried film 142 is formed reacts to engrave the trench. Thereafter, the fixed charge layer 143 is formed on the surface layer of the trenched trench, and then, the trench buried film 142 is formed so as to fill the trench.

At this time, at a portion of the trench buried films 142 in the circular annular structure intersecting the trench buried films 142 formed linearly in the horizontal direction and the vertical direction on the surface on which the pixel array is formed, the contact amount of the reactive gas varies, as engraving by reaction with the reactive gas progresses, depending on the portion of the annular structure and the depth of engraving changes.

For example, as illustrated in range Z1 of the upper right part of FIG. 3, the position P of the trench buried film 142 in the circular annular structure is a position corresponding to the position P illustrated in the lower center part of FIG. 3, and the reactive gas flows to the position P in two directions as indicated by arrows in the upper right part of FIG. 3. In contrast, the position Q of the trench buried film 142 in the annular structure is a position corresponding to the position Q in the lower right view of FIG. 3, and the reactive gas flows to the position Q in three directions as indicated by arrows in the upper right part of FIG. 3.

As a result, more reactive gas contacts the position Q than the position P, so that the position Q is engraved deeper than the position P to form a deeper trench corresponding to the contact amount of the reactive gas. Conversely, the position P is engraved shallower than the position Q to form a shallower trench corresponding to the smaller contact amount of the reactive gas than the position Q. As a result, a depth d1 of the trench at the position P in the lower center part of FIG. 3 is shallower than a depth d2 (>d1) of the trench at the position Q in the lower right portion of FIG. 3.

In other words, the reactive gas contacts the position Q from many directions larger than the number of directions at the position P, so that the contact amount of the reactive gas increases and the trench is engraved deeper (a processing conversion difference occurs). Therefore, it is possible, by adjusting the processing conversion difference, that the trench depth d2 at the position Q is configured to reach the substrate layer 102 and the trench depth d1 at the position P is configured not to reach the substrate layer 102. As a result, the trench buried films 142 having different depths can be formed by dry etching using one type of photomask pattern.

In other words, different photomask patterns have been required to form the trenches having different depths, but by using the photomask pattern using the processing conversion difference based on the microloading effect, a plurality of trenches having different depths can be processed by a single dry etching even with one photomask pattern.

As a result, the trenches having different depths can be achieved by a single dry etching using one photomask pattern, so that the periphery of the charge accumulation unit 123 can be surrounded by the trench buried film 142, as illustrated in the lower right view in FIG. 3, and the transfer transistor 122 is formed in the shallow portion of the trench buried film 142 to generate a charge transfer path, as illustrated in the lower center part of FIG. 3.

Note that the microloading effect is an effect in which, during dry etching, a portion to be etched with the reactive gas, in other words, a portion to be engraved through the contact with the reactive gas is engraved deeper, as the contact amount of the reactive gas per unit area is larger. Furthermore, in the following description, the difference caused by engraving using the microloading effect with respect to the depth of the trench to be engraved according to the difference in the contact amount of the reactive gas per unit area is also referred to as the processing conversion difference.

3. Manufacturing Processing of Imaging Device of FIG. 3

Figure 5:
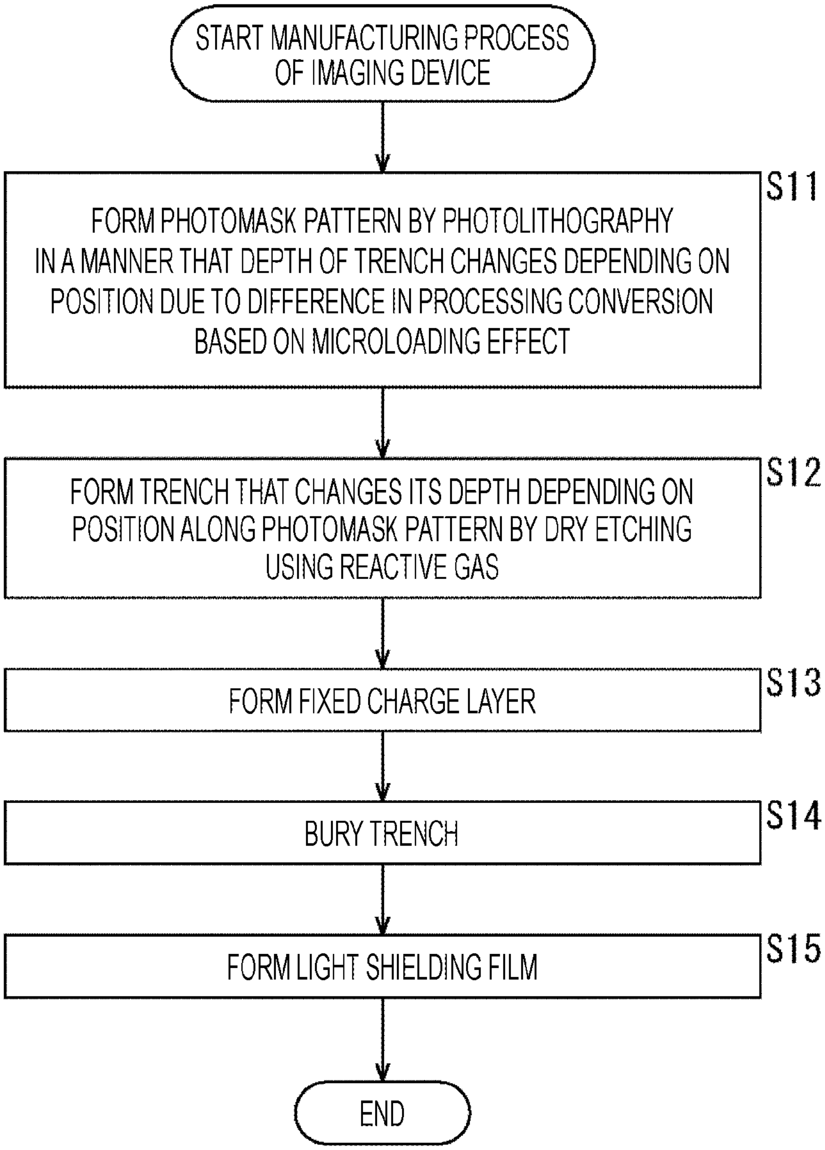
FIG. 5 is a flowchart for explaining a manufacturing processing of the imaging device in FIG. 3.

Next, the manufacturing processing of the imaging device in FIG. 3 will be described with reference to the flowchart in FIG. 5. Note that it is assumed that the photodiode 121, the transfer transistor 122, and the charge accumulation unit 123 are formed in advance.

In step S11, a photomask pattern is formed by photolithography so that the depth of the trench varies depending on the position due to the processing conversion difference based on the microloading effect. Here, the photomask pattern to be formed corresponds to the photodiode 121, the transfer transistor 122, and the charge accumulation unit 123 formed in advance.

In step S12, a trench whose depth changes according to the position along the photomask pattern is formed by dry etching using a reactive gas.

In other words, by forming the portion where the linear trench buried films 142 intersect in the horizontal direction and the vertical direction to be in the circular annular structure, the trenches having different depths are formed, as indicated by the positions P and Q illustrated in the upper right view of FIG. 3 described above.

In step S13, the fixed charge layer 143 is formed on the entire surface including the engraved trenches.

In step S14, the trench buried film 142 is buried in the engraved trench.

In step S15, the light shielding film 145 is formed.

Through the above processing, it is possible to form the trench buried films 142 having multiple depths by a single dry etching using one photomask pattern.

Note that, although the example has been described in which the trench buried films 142 having different depths are achieved by a single dry etching using one photomask pattern due to the processing conversion difference using the microloading effect, the trench buried films 142 having different depths may be formed by multiple times of dry etching using more than one photomask pattern.

4. First Modification

In the above description, the example in which the trench buried film 142 is constituted only by an insulating film having permeability has been described. Moreover, a metal film of the light shielding film 145 may be buried in the DTI.

Figure 6:
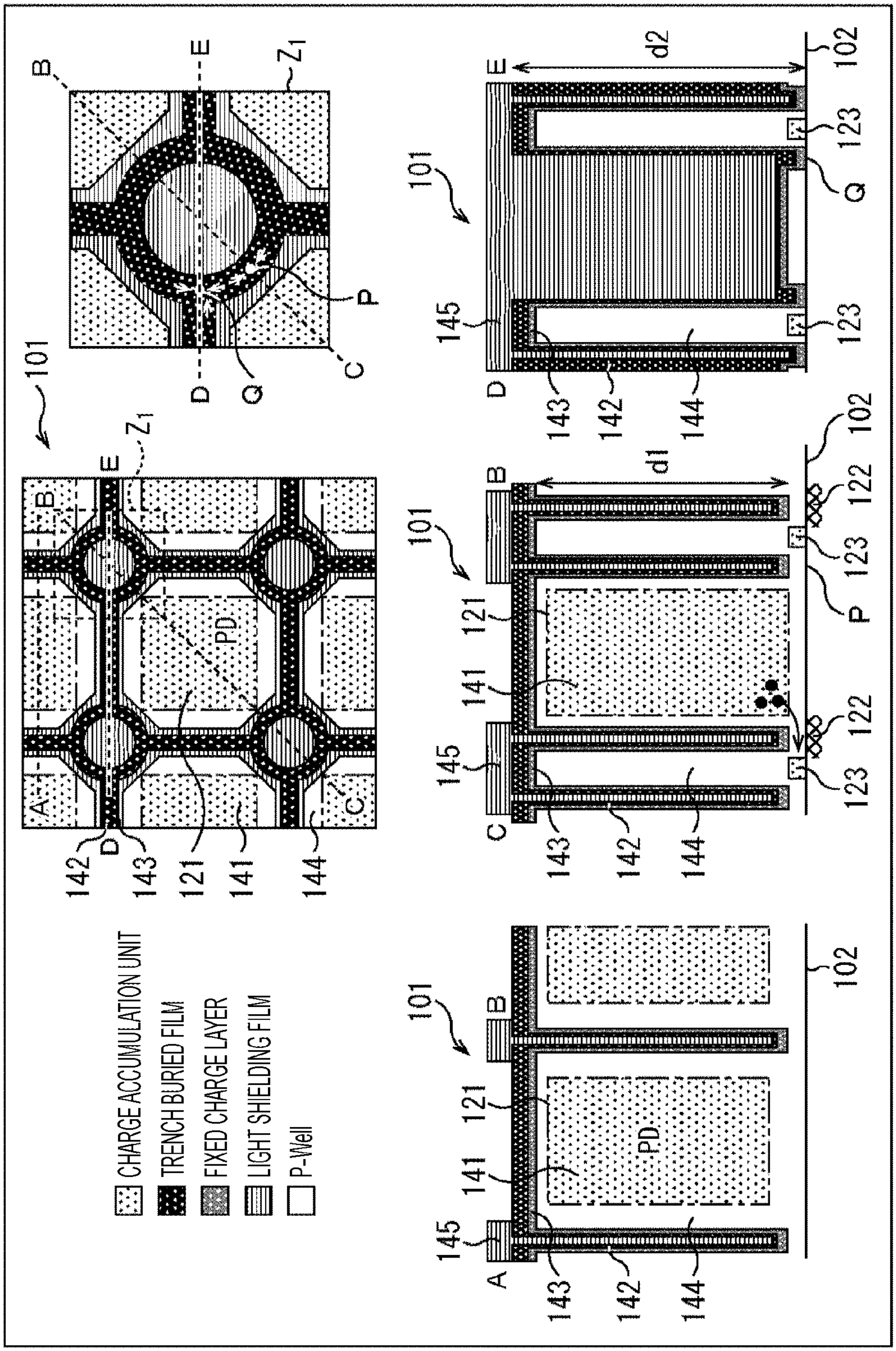
FIG. 6 is an explanatory diagram of a first modification.

In other words, as illustrated in lower part of FIG. 6, a metal film having light shielding characteristic continuing from the light shielding film 145 is buried in the DTI portion of the trench buried film 142. Light is reflected into the photodiode 121 by total reflection up to the critical angle of silicon and the trench buried film 142 constituted by an insulating film, but when the critical angle is exceeded, the light is reflected to or absorbed by the metal film forming the light shielding film 145, whereby color mixture is decreased.

5. Second Modification

In the above description, the example of the imaging device 101 has been described in which the intersection of the trench buried films 142 formed linearly with respect to the horizontal direction and the vertical direction of the surface on which the photodiodes 121 are arranged in an array is formed into a circular annular structure for connection. Alternatively, however, the connection at the intersection of the trench buried films 142 may be in the annular structure other than the circular structure as long as the structure is annular. For example, as illustrated in the left view in FIG. 7, the intersection of the trench buried films 142 formed linearly with respect to the horizontal direction and the vertical direction on the surface on which the photodiodes 121 are arranged in an array may be in a rhombic annular structure, or in a rectangular shape as illustrated in the right view in FIG. 7.

Figure 7:
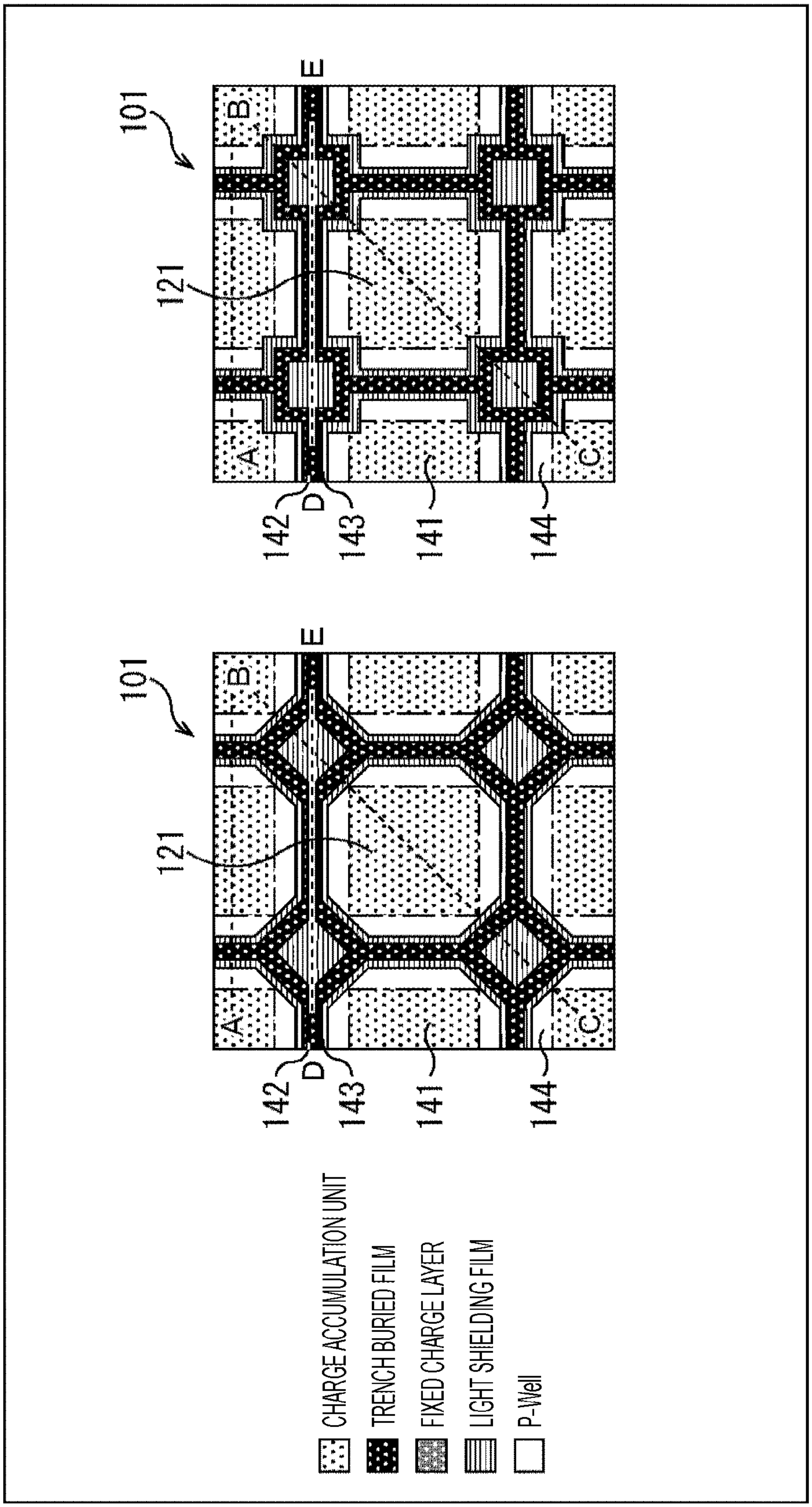
FIG. 7 is an explanatory diagram of a second modification.

In both right and left parts of FIG. 7, the basic configurations of cross-sections cut along lines A-B, C-B, and D-E are similar to the cross-sections in the lower part of FIG. 3. However, the width and the position in the horizontal direction in the three kinds of cross-sections of the lower views in FIG. 3 are different depending on the difference in shape.

Furthermore, the structure may not be in the circular structure including the structures illustrated in FIG. 7 as long as the annular structure is provided. However, for the range other than the range in which the charge transfer path is formed due to the processing conversion difference caused by the microloading effect, a deep trench buried film 142 is formed to reach the substrate layer 102 so as to light-shield the charge accumulation unit 123. For the range in which the transfer transistor 122 is formed, a shallow trench buried film 142 is formed not to reach the substrate layer 102 so as to allow functioning as the charge transfer path.

In any annular structure, the trench for forming the trench buried films 142 having different depths for forming the transfer transistor serving as a charge transfer path to the photodiode 121 while light-shielding the charge accumulation unit 123 can be formed by a single dry etching using one photomask pattern, so that the number of mask patterns and processing steps can be reduced. As a result, the manufacturing cost can be reduced.

6. Third Modified Example

In the above description, the example of the imaging device 101 in which the intersections of the trench buried films 142 formed linearly in the horizontal direction and the vertical direction on the surface on which the photodiodes 121 are arranged in an array are formed in the annular structure to adjust the depths of the trench buried films 142 by the processing conversion difference caused by the microloading effect has been described. Alternatively, the width in the photolithography for forming the trench for forming the trench buried films 142 may be changed to adjust the contact amount (contact area) with the reactive gas so as to adjust the depth of the trench to be engraved.

Figure 8:
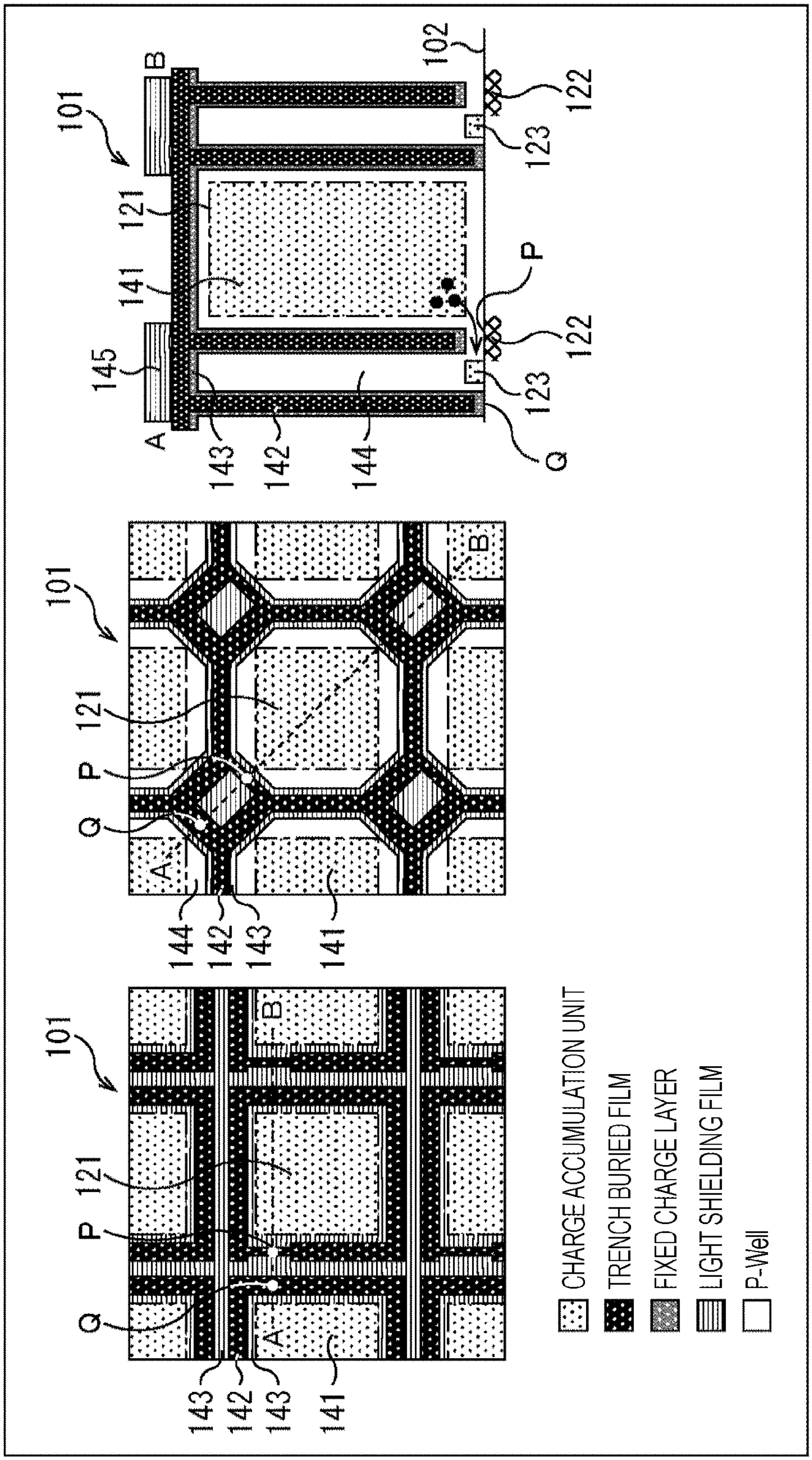
FIG. 8 is an explanatory diagram of a third modification.

In other words, as illustrated in the left part of FIG. 8, the trench buried films 142 are formed to surround the photodiodes 121 individually on the surface on which the photodiodes 121 are arranged in an array. Furthermore, the width of the trench buried film 142 set by the photomask pattern is different between the positions P and Q on line A-B of the left view in FIG. 8, and the width of the trench buried film 142 around the position Q is set wider than the width of the trench buried film 142 around the position P. With such a configuration, the contact amount of the reactive gas is larger at the position Q than at the position P.

Thus, as illustrated in the right part of FIG. 8, the depth of the trench buried film 142 is deeper at the position Q than at the position P, and reaches the substrate layer 102 to form a complete light shielding space of the charge accumulation unit 123. On the other hand, the trench buried portion 142 at the position P becomes shallower than the depth of the trench buried film 142 at the position Q and does not reach the substrate layer 102. As a result, the substrate layer 102 is not reached at the position P, so that the transfer transistor 122 is provided to function as the charge transfer path.

Furthermore, as illustrated in the center part of FIG. 8, the intersection of the linear trench buried films 142 linearly formed in the horizontal direction and the vertical direction on the surface on which the photodiodes 121 are arranged in an array is formed in the annular structure. In addition, the width of the trench buried film 142 may be changed to adjust the depth.

In other words, in the center part of FIG. 8, the intersections of the trench buried films 142 linearly formed in the horizontal direction and the vertical direction on the surface on which the photodiodes 121 are arranged in an array are formed in the annular structure, but the width of the trench buried films 142 set by the photomask pattern is different between the positions P and Q on line A-B, and the width of the trench buried film 142 around the position Q is set wider than the width of the trench buried film 142 at the position P. With such a configuration, the contact amount of the reactive gas is larger at the position Q than at the position P.

Thus, as illustrated in the right part of FIG. 8, the depth of the trench buried film 142 is deeper at the position Q than at the position P, and reaches the substrate layer 102 to form a complete light shielding space of the charge accumulation unit 123. On the other hand, the trench buried portion 142 at the position P becomes shallower than the depth of the trench buried film 142 at the position Q and does not reach the substrate layer 102, so that the transfer transistor 122 is provided to function as the charge transfer path.

In other words, the left and center parts of FIG. 8 are configuration examples in which the number and intersections of the trench buried films 142 formed linearly in the horizontal direction and the vertical direction on the surface on which the photodiodes 121 are arranged in an array are different, but both cross-sectional views along line A-B are illustrated in the right part of FIG. 8. Note that the cross-sectional views along line A-B of the left and center parts of FIG. 8 and are specifically different in the widths and positions in the horizontal direction, but the outer shape is mostly similar to each other.

In any structure, the trench for forming the trench buried films 142 having different depths for forming the transfer transistor serving as a charge transfer path to the photodiode 121 while light-shielding the charge accumulation unit 123 can be formed by a single dry etching using one photomask pattern, so that the number of mask patterns and processing steps can be reduced. As a result, the manufacturing cost can be reduced.

7. Fourth Modified Example

In the above description, the example of the imaging device 101 in which the charge accumulation unit 123 is the floating diffusion region (FD) set for each photodiode has been described. Alternatively, the charge accumulation unit 123 may be provided as a memory shared by a plurality of photodiodes, instead of the floating diffusion region (FD).

Figure 9:
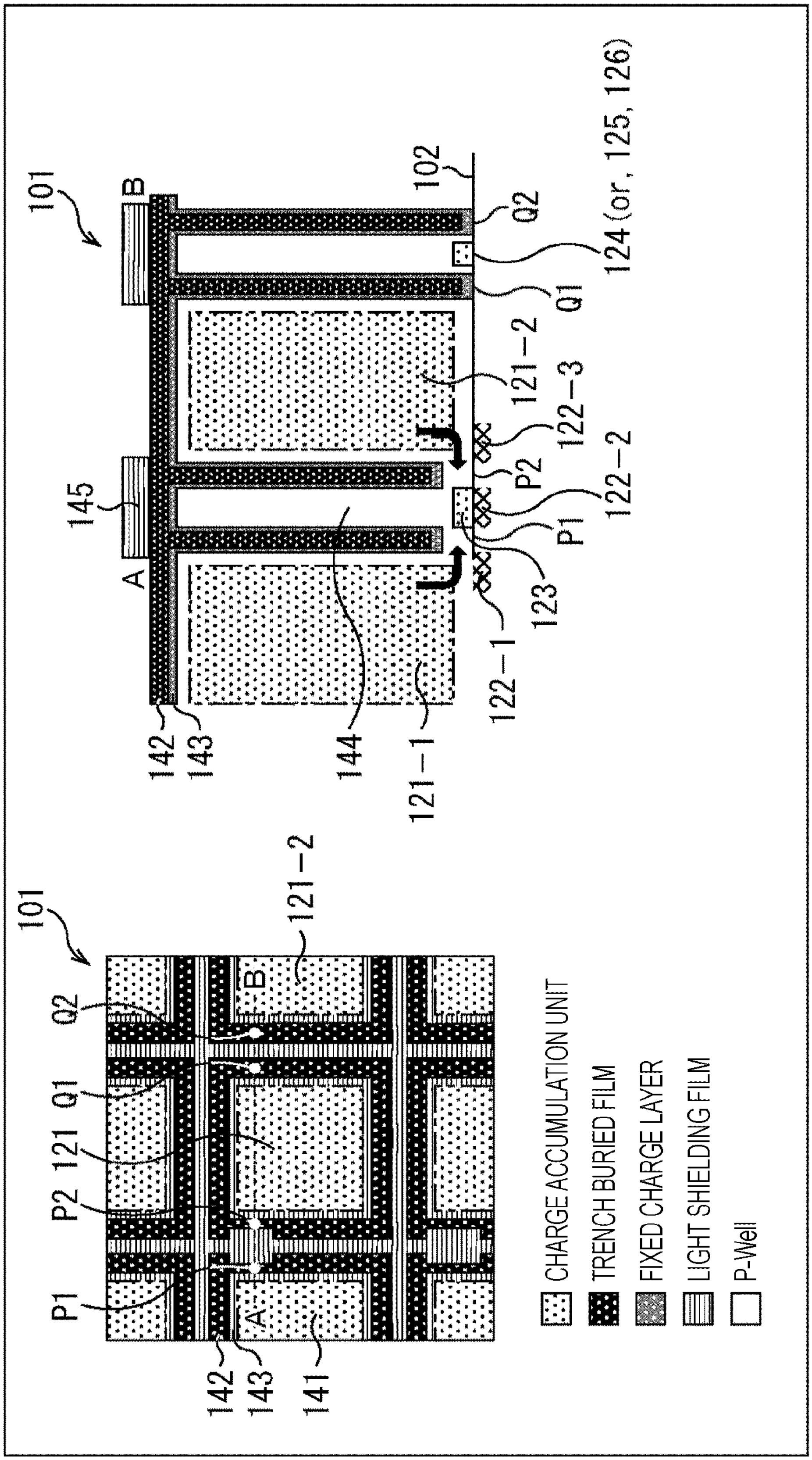
FIG. 9 is an explanatory diagram of a fourth modification.

In this case, for example, as illustrated at line A-B in the left part of FIG. 9, the width of a part of the trench buried film 142 surrounding each of the photodiodes 121 around the positions P1 and P2 is formed to be narrower than the widths around the positions Q1 and Q2. This reduces the contact amount of the reactive gas during dry etching and, as illustrated in the right view in FIG. 7, the depth of the trench buried film 142 between adjacent photodiodes 121-1 and 121-2 is made shallower so as not to reach the substrate layer 102.

With such a configuration, transfer transistors 122-1 to 122-3 that connect the memory serving as the charge accumulation unit 123 and a plurality of photodiodes 121 including the photodiodes 121-1, 121-2, and so on are provided on the bottom of the space between the positions P1 and P2 and on the substrate layer 102 to function as the charge transfer path from the plurality of photodiodes 121.

On the other hand, the trench buried film 142 at the positions Q1 and Q2 is wider than the trench buried film 142 at the positions P1 and P2, so that the contact amount of the reactive gas during dry etching increases and deeper engraving is allowed to reach the substrate layer 102. With such a structure, it is possible to form a light shielding space between the trench buried films 142 and, for example, a pixel transistor such as any one of the transistors 124 to 126 can be formed.

With the above structure, the trench buried films 142 including the trench buried film 142, which has a depth reaching the substrate layer 102 that light-shields the charge accumulation unit 123, and the trench buried film 142, which has a depth not reaching the substrate layer 102 and forming the transfer transistor serving as the charge transfer path to the photodiodes 121, are formed by a single dry etching using one photomask Pattern. This reduces the number of photomask patterns and the number of processing steps. As a result, the manufacturing cost can be reduced.

To summarize the above, the dry etching is performed by using the photomask pattern in which the width of the trench buried film 142 that light-shields the floating diffusion region (FD) or the charge accumulation unit 123 constituting the memory, and the width of the trench buried film 142 for forming the transfer transistor functioning as the charge transfer path from the photodiodes 121, with the trench buried films 142 having different depths, are adjusted to control the contact amount of the reaction gas, the trench buried films 142 having multiple depths are formed by a single dry etching with one photomask pattern. As a result, the manufacturing cost of the imaging device can be reduced by reducing the number of photomask patterns and the number of steps of dry etching.

More specifically, the mask pattern for forming the trench buried film 142 that light-shields the floating diffusion region (FD) or the charge accumulation unit 123 constituting the memory is formed to increase the contact area or the number of flow paths of the reactive gas to increase the contact amount of the reactive gas, thus increasing the depth of the trench buried film 142 in a manner that the deepest portion of the trench buried film 142 can reach the substrate layer 102.

On the other hand, the mask pattern for forming the trench buried film 142 forming the transfer transistor to function as the charge transfer path from the photodiodes 121 is formed such that the deepest portion of the trench buried film 142 does not reach the substrate layer 102. Thus, the contact amount of the reactive gas is reduced compared to the portion for forming the trench buried film 142 for light shielding, so that the contact area or the number of flow paths of the reactive gas is reduced.

By forming the mask pattern having the above characteristics, the trench buried films 142 each having appropriate depth for the portion forming a space for light-shielding the charge accumulation unit 123 and the Portion forming the transfer transistor functioning as the charge transfer path can be formed by a single dry etching using one mask pattern. As a result, the mask pattern is reduced, the number of times of dry etching, in other words, the manufacturing steps, is reduced, and the manufacturing cost is reduced.

8. Application Example to Electronic Device

The above-described imaging device can be applied to various electronic devices including an imaging apparatus, such as a digital still camera, a digital video camera, or the like, a mobile phone with an imaging function, or other devices with an imaging function.

Figure 10:
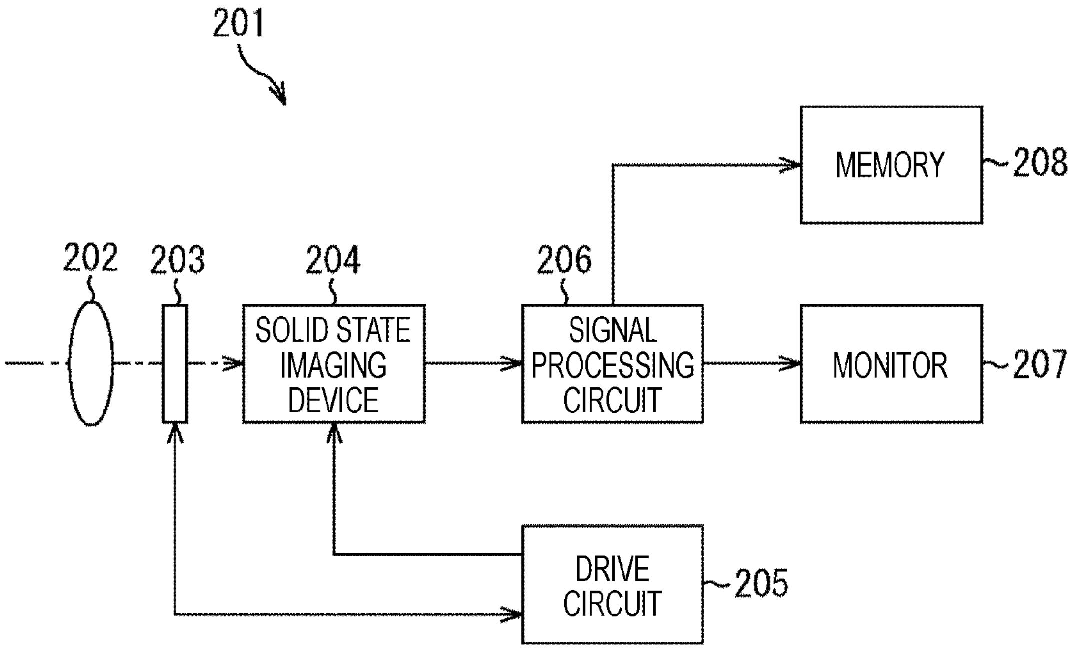
FIG. 10 is a block diagram illustrating a configuration example of an imaging apparatus as an electronic device to which an imaging device of the present disclosure is applied.

FIG. 10 is a block diagram illustrating a configuration example of an imaging apparatus as an electronic device to which the present technology is applied.

An imaging apparatus 201 illustrated in FIG. 10 includes an optical system 202, a shutter device 203, a solid-state imaging device 204, a drive circuit 205, a signal processing circuit 206, a monitor 207, and a memory 208, and is capable of capturing a still image and a moving image.

The optical system 202 includes one or a plurality of lenses, and guides light (incident light) from a subject to the solid-state imaging device 204 and forms an image on the light-receiving surface of the solid-state imaging device 204.

The shutter device 203 is disposed between the optical system 202 and the solid-state imaging device 204, and controls the light irradiation period and the light shielding period to the solid-state imaging device 204 under the control of the drive circuit 1005.

The solid-state imaging device 204 is constituted by a package including the above-described solid-state imaging device. The solid-state imaging device 204 accumulates the signal charge for a certain period in accordance with light formed on the light receiving surface via the optical system 202 and the shutter device 203. The signal charges accumulated in the solid-state imaging device 204 are transferred in accordance with a drive signal (timing signal) supplied from the drive circuit 205.

The drive circuit 205 outputs a drive signal for controlling the transfer operation of the solid-state imaging device 204 and the shutter operation of the shutter device 203 to drive the solid-state imaging device 204 and the shutter device 203.

The signal processing circuit 206 performs various signal processing on signal charges output from the solid-state imaging device 204. An image (image data) obtained by performing signal processing by the signal processing circuit 206 is supplied to the monitor 207 and displayed or supplied to the memory 208 and stored (recorded).

To the imaging apparatus 201 configured as described above, the imaging device 101 illustrated in FIG. 3 of the present disclosure may also be applied, instead of the above-described optical system 202, the shutter device 203, and the solid-state imaging device 204, to reduce the manufacturing cost.

9. Usage Example of Imaging Device

Figure 11:
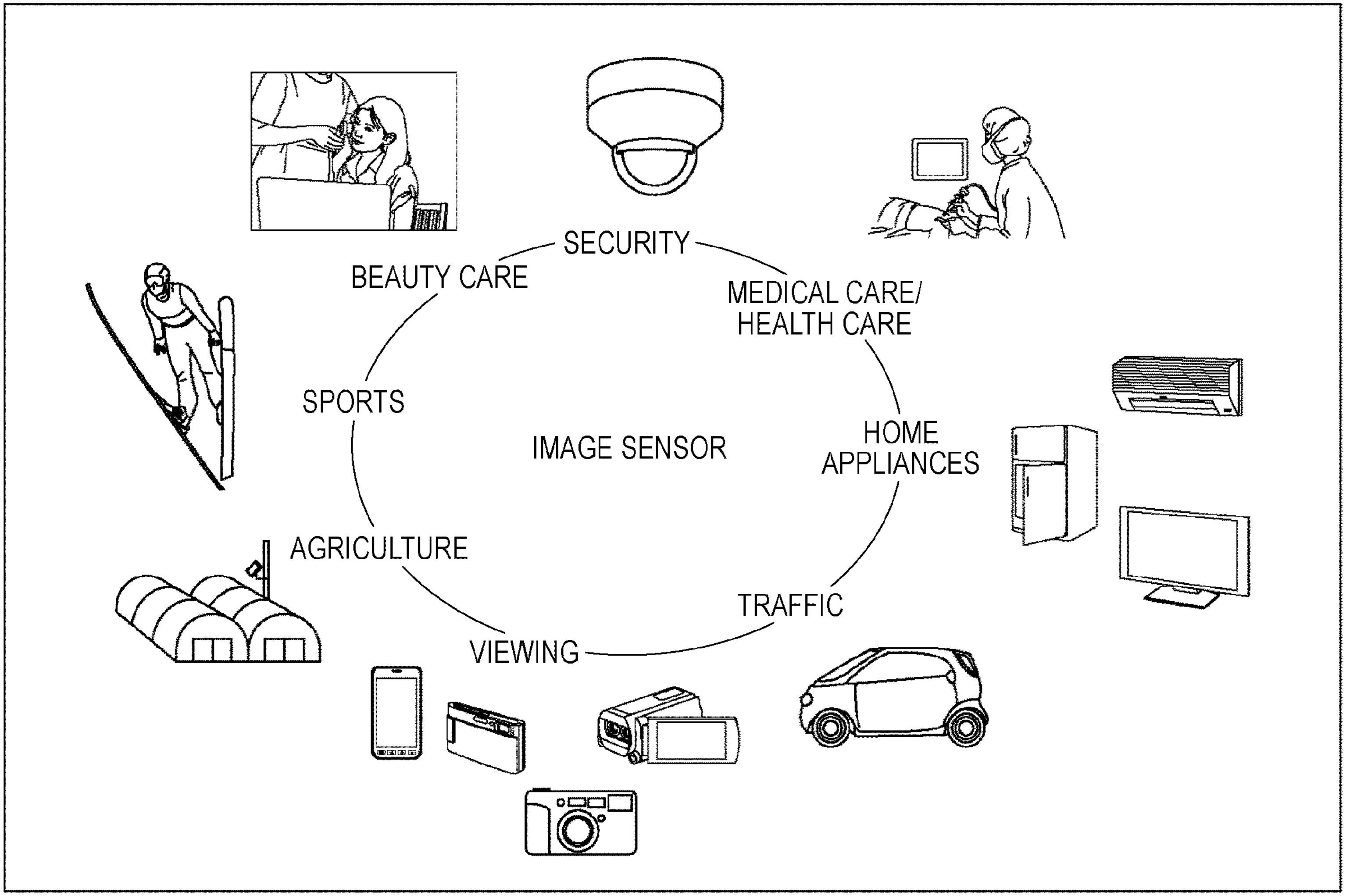
FIG. 11 illustrates example usages of the imaging device to which the technology of the present disclosure is applied.

FIG. 11 illustrates application examples using the imaging device 101 of FIG. 3 described above.

The imaging device described above can be used in various occasions below for sensing light, such as visible light, infrared light, traviolet light, X-rays, or the like.

A device for shooting images for appreciation use, such as a digital camera, a portable device with camera function, and so on.

A device used for traffic to achieve safety driving, such as automatic stopping, recognizing conditions of a driver, and so on, including an on-board sensor for shooting the front and rear, surroundings, interior, or the like, of a vehicle, a monitoring camera for monitoring running vehicles and road conditions, a distance measuring sensor measuring the distance between vehicles or the like, and so on.

A device used for home appliances, such as a TV, a refrigerator, or an air-conditioner, to shoot gestures of a user and operate the device in accordance with the gestures.

A device used for medical care or health care, such as an endoscope or an angiography device which operates by receiving infrared light.

A device used for security, such as a monitoring camera for crime prevention or a camera for personal authentication.

A device for beauty care, such as a skin analyzer for shooting the skin or a microscope for shooting scalp.

A device used for sports, such as an action camera or a wearable camera used in sports or the like.

A device used for agriculture, such as a camera for monitoring fields and conditions of crops.

Note that the present disclosure can also be configured in the following structures.

<1> an Imaging Device Including a plurality of photodiodes arranged in an array and generating an electric charge according to an amount of incident light, a charge accumulation unit that accumulates the electric charge transferred from each of the photodiodes, and a light shielding wall that separately light-shields the photodiode and the charge accumulation unit, in which the light shielding wall is configured to surround the charge accumulation unit, with a part of the light shielding wall having a first depth and the other parts of the light shielding wall having a second depth, and the first depth and the second depth of the light shielding wall are formed by dry etching with a photomask pattern using a processing conversion difference caused by a microloading effect.

<2> The imaging device according to <1>, in which the light shielding wall is configured to surround the charge accumulation unit, in which a portion functioning as a charge transfer path for transferring the electric charge from the photodiode to the charge accumulation unit is formed to have a first depth not reaching a substrate layer from a surface on which the photodiodes are arranged in an array, and the other portions are formed to have a second depth reaching the substrate layer from the surface on which the photodiodes are arranged in an array, whereby the light shielding wall having the first depth and the second depth is formed by a single dry etching with one photomask pattern controlled using the processing conversion difference caused by the microloading effect.

<3> The imaging device according to <2>, in which the charge accumulation unit is shared by a plurality of photodiodes, and the charge transfer path is formed between the plurality of photodiodes.

<4> The imaging device according to <1>, in which the photomask pattern controls a depth of a trench forming the light shielding wall by the dry etching by controlling a contact amount of a reactive gas, which is used in the dry etching, on a silicon substrate.

<5> The imaging device according to <4>, in which the photomask pattern controls the depth of the trench that forms the light shielding wall by the dry etching by controlling a contact area of the reactive gas, which is used in the dry etching, on the silicon substrate or controlling a contact amount of the reactive gas according to the number of flow paths of the reactive gas.

<6> The imaging device according to <5>, in which the photomask pattern is formed in an annular structure surrounding the charge accumulation unit and controls the contact amount of the reactive gas according to the number of the flow paths.

<7> The imaging device according to <6>, in which the annular structure is circular, rhombic, rectangular, or polygonal.

<8> The imaging device according to any one of <1> to <7>, in which the charge accumulation unit includes a floating diffusion region and a memory.

<9> The imaging device according to any one of <1> to <8>, in which the light shielding wall is formed by an insulating film having permeability and a refractive index lower than a refractive index of silicon, or the insulating film in which a light shielding metal is provided inside the insulating film.

<10> An imaging apparatus including a plurality of photodiodes arranged in an array and generating an electric charge according to an amount of incident light, a charge accumulation unit that accumulates the electric charge transferred from each of the photodiodes, and a light shielding wall that separately light-shields the photodiode and the charge accumulation unit, in which the light shielding wall is configured to surround the charge accumulation unit, with a part of the light shielding wall having a first depth and the other parts of the light shielding wall having a second depth, and the first depth and the second depth of the light shielding wall are formed by dry etching with a photomask pattern using a processing conversion difference caused by a microloading effect.

<11> An electronic device including a plurality of photodiodes arranged in an array and generating an electric charge according to an amount of incident light, a charge accumulation unit that accumulates the electric charge transferred from each of the photodiodes, and a light shielding wall that separately light-shields the photodiode and the charge accumulation unit, in which the light shielding wall is configured to surround the charge accumulation unit, with a part of the light shielding wall having a first depth and the other parts of the light shielding wall having a second depth, and the first depth and the second depth of the light shielding wall are formed by dry etching with a photomask pattern using a processing conversion difference caused by a microloading effect.

REFERENCE SIGNS LIST

101 Imaging device
102 Substrate layer
121 Photodiode
122 Transfer transistor
123 Charge accumulation unit
124 Reset transistor
125 Amplification transistor
126 Selection transistor
127 Vertical transfer line
141 N-type layer
142 Trench buried layer
143 Fixed charge layer
144 P-Well
145 Light shielding film

What is claimed is:

1. An imaging device, comprising:

a plurality of photodiodes arranged in an array and generating an electric charge according to an amount of incident light;

a charge accumulation unit that accumulates the electric charge transferred from each of the photodiodes, wherein the charge accumulating unit is provided in a plane beneath the plurality of photodiodes in a cross-sectional view; and a light shielding wall including top segments provided around an entire perimeter of a top surface of each of the plurality of photodiodes in a plan view and vertical segments extending from the top segments in the cross-sectional view, wherein the light shielding wall separately light-shields the photodiodes and the charge accumulation unit, and wherein the light shielding wall is configured to surround the charge accumulation unit, with one of the vertical segments having a first depth and another of the vertical segments having a second depth, and the first depth and the second depth of the light shielding wall are formed by dry etching with a photomask pattern using a processing conversion difference caused by a microloading effect.

2. The imaging device according to claim 1, wherein the charge accumulation unit is shared by the plurality of photodiodes, and a charge transfer path for transferring the electric charge from each of the photodiodes to the charge accumulation unit is formed between the plurality of photodiodes.

3. The imaging device according to claim 1, wherein the photomask pattern controls a depth of a trench forming the light shielding wall by the dry etching by controlling a contact amount of a reactive gas, which is used in the dry etching, on a silicon substrate.

4. The imaging device according to claim 3, wherein the photomask pattern controls the depth of the trench that forms the light shielding wall by the dry etching by controlling a contact area of the reactive gas, which is used in the dry etching, on the silicon substrate or controlling a contact amount of the reactive gas according to a number of flow paths of the reactive gas.

5. The imaging device according to claim 4, wherein the photomask pattern is formed in an annular structure surrounding the charge accumulation unit and controls the contact amount of the reactive gas according to the number of the flow paths.

6. The imaging device according to claim 5, wherein the annular structure is circular, rhombic, rectangular, or polygonal.

7. The imaging device according to claim 1, wherein the charge accumulation unit includes a floating diffusion region and a memory.

8. The imaging device according to claim 1, wherein the light shielding wall is formed by an insulating film having permeability and a refractive index lower than a refractive index of silicon, or the insulating film in which a light shielding metal is provided inside the insulating film.

9. The imaging device according to claim 1, wherein a portion of one of the top segments has a width narrower than a width of a remainder of the one of the top segments.

10. An imaging apparatus, comprising:

a plurality of photodiodes arranged in an array and generating an electric charge according to an amount of incident light;

a charge accumulation unit that accumulates the electric charge transferred from each of the photodiodes, wherein the charge accumulating unit is provided in a plane beneath the plurality of photodiodes in a cross-sectional view; and a light shielding wall including top segments provided around an entire perimeter of a top surface of each of the plurality of photodiodes in a plan view and vertical segments extending from the top segments in the cross-sectional view, wherein the light shielding wall separately light-shields the photodiodes and the charge accumulation unit, and wherein the light shielding wall is configured to surround the charge accumulation unit, with one of the vertical segments having a first depth and another of the vertical segments having a second depth, and the first depth and the second depth of the light shielding wall are formed by dry etching with a photomask pattern using a processing conversion difference caused by a micro-loading effect.

11. The imaging apparatus according to claim 10, wherein the charge accumulation unit is shared by the plurality of photodiodes, and a charge transfer path for transferring the electric charge from each of the photodiodes to the charge accumulation unit is formed between the plurality of photodiodes.

12. The imaging apparatus according to claim 10, wherein the charge accumulation unit includes a floating diffusion region and a memory.

13. The imaging apparatus according to claim 10, wherein the light shielding wall is formed by an insulating film having permeability and a refractive index lower than a refractive index of silicon, or the insulating film in which a light shielding metal is provided inside the insulating film.

14. The imaging apparatus according to claim 10, wherein a portion of one of the top segments has a width narrower than a width of a remainder of the one of the top segments.

15. An electronic device, comprising:

a plurality of photodiodes arranged in an array and generating an electric charge according to an amount of incident light;

a charge accumulation unit that accumulates the electric charge transferred from each of the photodiodes, wherein the charge accumulating unit is provided in a plane beneath the plurality of photodiodes in a cross-sectional view; and a light shielding wall including top segments provided around an entire perimeter of a top surface of each of the plurality of photodiodes in a plan view and vertical segments extending from the top segments in the cross-sectional view, wherein the light shielding wall separately light-shields the photodiodes and the charge accumulation unit, and wherein the light shielding wall is configured to surround the charge accumulation unit, with one of the vertical segments having a first depth and another of the vertical segments having a second depth, and the first depth and the second depth of the light shielding wall are formed by dry etching with a photomask pattern using a processing conversion difference caused by a micro-loading effect.

16. The electronic device according to claim 15, wherein the charge accumulation unit is shared by the plurality of photodiodes, and the charge transfer path for transferring the electric charge from each of the photodiodes to the charge accumulation unit is formed between the plurality of photodiodes.

17. The electronic device according to claim 15, wherein the charge accumulation unit includes a floating diffusion region and a memory.

18. The electronic device according to claim 15, wherein the light shielding wall is formed by an insulating film having permeability and a refractive index lower than a refractive index of silicon, or the insulating film in which a light shielding metal is provided inside the insulating film.

19. The electronic device according to claim 15, wherein a portion of one of the top segments has a width narrower than a width of a remainder of the one of the top segments.

* * * * *